(12) United States Patent
Aras et al.

(10) Patent No.: US 10,554,203 B1
(45) Date of Patent: Feb. 4, 2020

(54) RADIO FREQUENCY DETECTION CIRCUIT

(71) Applicant: TEXAS INSTRUMENTS INCORPORATED, Dallas, TX (US)

(72) Inventors: Sualp Aras, Dallas, TX (US); Eung Jung Kim, Allen, TX (US); Abidur Md Rahman, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/206,317

(22) Filed: Nov. 30, 2018

(51) Int. Cl.
*H03K 17/16* (2006.01)
*G01R 31/00* (2006.01)
*G01R 19/165* (2006.01)

(52) U.S. Cl.
CPC ..... *H03K 17/162* (2013.01); *G01R 19/16552* (2013.01); *G01R 31/002* (2013.01)

(58) Field of Classification Search
CPC ...................................................... H03K 17/16
See application file for complete search history.

(56) References Cited

U.S. PATENT DOCUMENTS

| | | | | |
|---|---|---|---|---|
| 5,276,358 A | * | 1/1994 | Carvajal | H03K 17/166 327/13 |
| 6,812,686 B2 | * | 11/2004 | Chaoui | G01R 19/04 324/95 |
| 9,871,514 B1 | * | 1/2018 | Schulmeyer | H03K 17/0822 |

* cited by examiner

*Primary Examiner* — Patrick O Neill
(74) *Attorney, Agent, or Firm* — Tuenlap Chan; Charles A. Brill; Frank D. Cimino

(57) ABSTRACT

In some examples, the disclosure includes a circuit including a power field effect transistor (FET), a gate pull-down circuit, a pull-down bias circuit, and a radio frequency (RF) detector coupled to the source terminal of the power FET and the pull-down bias circuit. In an example, the RF detector circuit is configured to detect a presence of an alternating current signal at a source terminal of the power FET when the power FET is in a non-conductive state and control the pull-down bias circuit to bias the gate pull-down circuit to create a low impedance path between a gate terminal of the power FET and the source terminal of the power FET when the power FET is in the non-conductive state and the alternating current signal is present at the source terminal of the power FET.

20 Claims, 10 Drawing Sheets

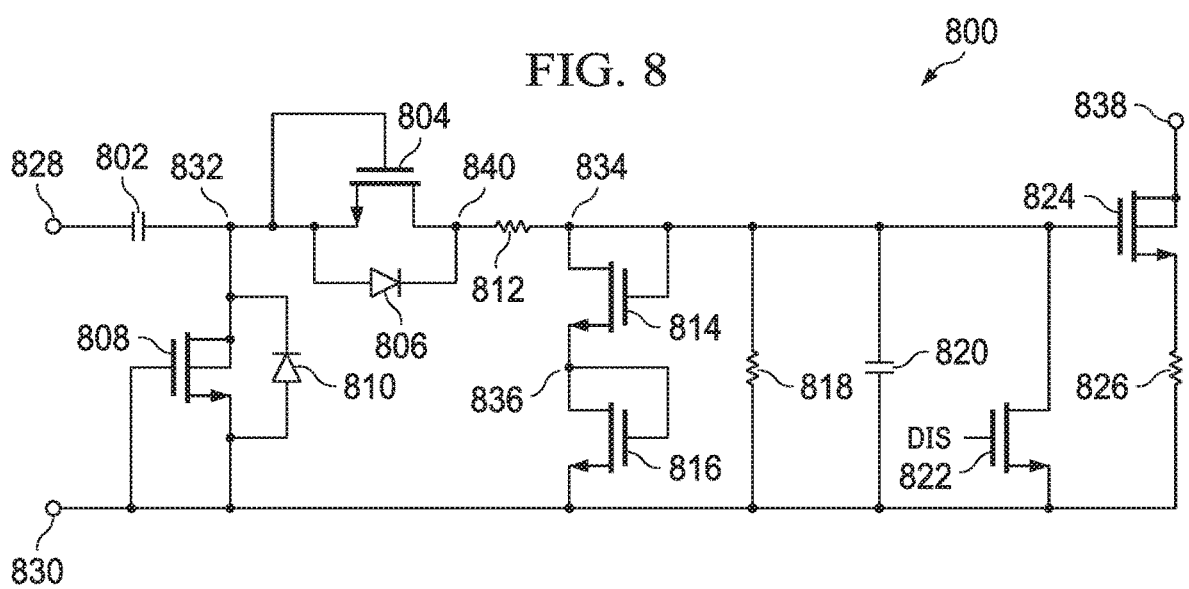
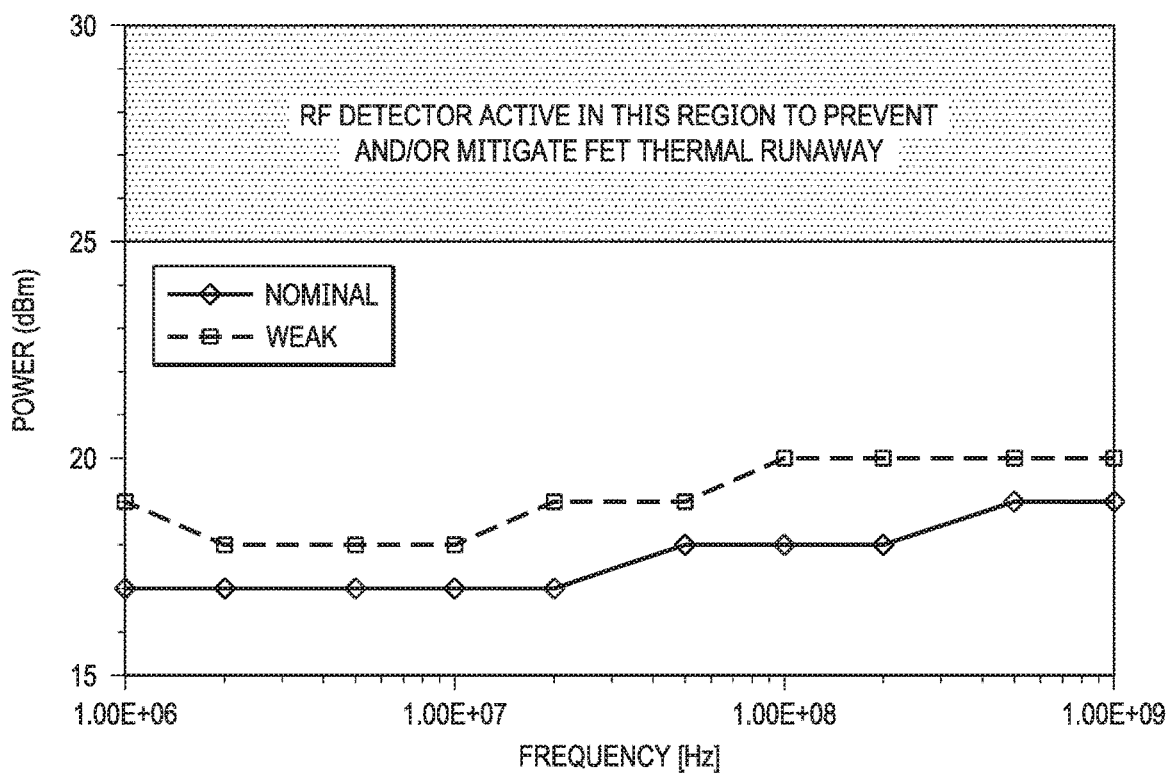

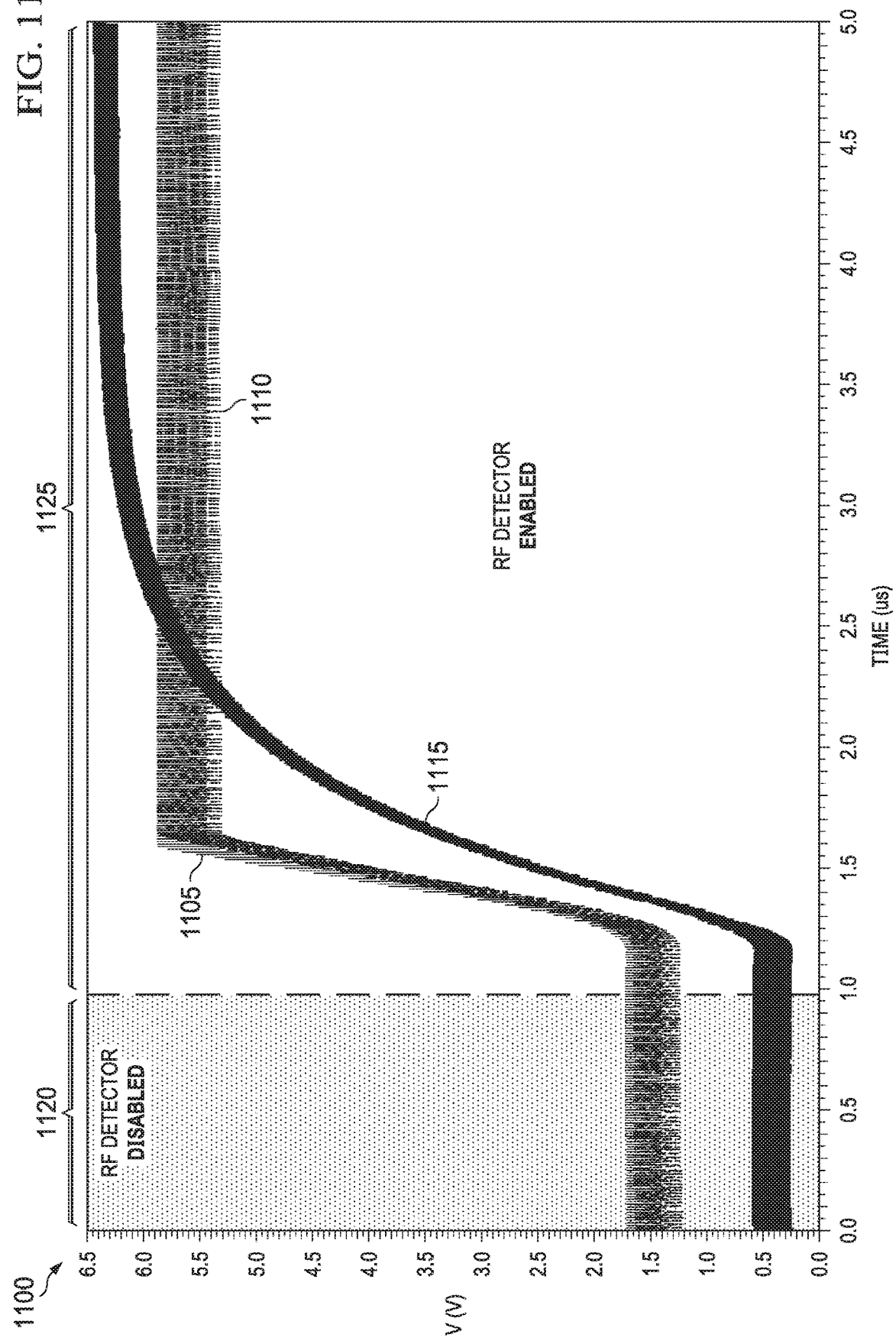

RADIO FREQUENCY DETECTION CIRCUIT

SUMMARY

At least some aspects of the disclosure provide for a circuit. In some examples, the circuit includes a first capacitor, a first transistor, a second transistor, a first resistor, a second resistor, a second capacitor, a third transistor, a fourth transistor, and a third resistor. The first capacitor has a first terminal coupled to a first node and a second terminal coupled to a second node. The first transistor has a drain terminal coupled to the second node, a source terminal coupled to a ground node, and a gate terminal coupled to the ground node. The second transistor has a gate terminal coupled to the second node, a source terminal coupled to the second node, and a drain terminal coupled to a third node. The first resistor is coupled between the third node and a fourth node. The second resistor is coupled between the fourth node and the ground node. The second capacitor is coupled between the fourth node and the ground node. The third transistor has a drain terminal coupled to the fourth node, a source terminal coupled to the ground node, and a gate terminal. The fourth transistor has a gate terminal coupled to the fourth node, a drain terminal coupled to a fifth node, and a source terminal. The third resistor is coupled between the source terminal of the fourth transistor and the ground node.

Other aspects of the disclosure provide for a system. In some examples, the system includes a radio frequency (RF) detector, a gate pull-down circuit, a pull-down bias circuit, a power FET, and a load. In an example, the RF detector includes a first capacitor, a first transistor, a second transistor, a first resistor, a second resistor, a second capacitor, a third transistor, a fourth transistor, and a third resistor. The first capacitor has a first terminal coupled to a first node and a second terminal coupled to a second node. The first transistor has a drain terminal coupled to the second node, a source terminal coupled to a ground node, and a gate terminal coupled to the ground node. The second transistor has a gate terminal coupled to the second node, a source terminal coupled to the second node, and a drain terminal coupled to a third node. The first resistor is coupled between the third node and a fourth node. The second resistor is coupled between the fourth node and the ground node. The second capacitor is coupled between the fourth node and the ground node. The third transistor has a drain terminal coupled to the fourth node, a source terminal coupled to the ground node, and a gate terminal. The fourth transistor has a gate terminal coupled to the fourth node, a drain terminal coupled to a fifth node, and a source terminal. The third resistor is coupled between the source terminal of the fourth transistor and the ground node. The gate pull-down circuit includes a fifth transistor, a sixth transistor, a seventh transistor, a first diode, a second diode, and a fourth resistor. The fifth transistor has a gate terminal coupled to a sixth node, a drain terminal coupled to a seventh node, and a source terminal coupled to an eighth node. The sixth transistor has a gate terminal coupled to a ninth node, a drain terminal coupled to the eighth node, and a source terminal coupled to a tenth node. The seventh transistor has a gate terminal coupled to an eleventh node, a drain terminal coupled to the tenth node, and a source terminal coupled to the first node. The first diode is coupled between the eighth node and the sixth node. The second diode is coupled between the tenth node and the ninth node. The fourth resistor is coupled between the seventh node and the first node. The pull-down bias circuit includes an eighth transistor and a ninth transistor. The eighth transistor has a drain terminal coupled to the fifth node, a gate terminal coupled to the fifth node, and a source terminal configured to couple to a second power supply and the ninth transistor has a gate terminal coupled to the fifth node, a source terminal configured to couple to the second power supply, and a drain terminal coupled to the sixth node. The tenth transistor has a gate terminal coupled to the fifth node, a source terminal configured to couple to the second power supply, and a drain terminal coupled to the ninth node. The eleventh transistor has a gate terminal coupled to the fifth node, a source terminal configured to couple to the second power supply, and a drain terminal coupled to the eleventh node. The power FET has a gate terminal coupled to the seventh node, a source terminal coupled to the first node, and a drain terminal configured to couple to a first power supply. The load has a first terminal coupled to the first node and a second terminal coupled to the ground node.

Other aspects of the present disclosure provide for a circuit. In an example, the circuit includes a power FET, a gate pull-down circuit, a pull-down bias circuit, and a RF detector. The power FET has a gate terminal, a source terminal, and a drain terminal. The gate pull-down circuit is configured to couple to the gate terminal of the power FET and the source terminal of the power FET to control operation of the power FET. The pull-down bias circuit is coupled to the gate pull-down circuit. The RF detector is coupled to the source terminal of the power FET and the pull-down bias circuit. The RF detector is configured to detect a presence of an alternating current signal at the source terminal of the power FET when the power FET is in a non-conductive state and control the pull-down bias circuit to bias the gate pull-down circuit to create a low impedance path between the gate terminal of the power FET and the source terminal of the power FET when the power FET is in the non-conductive state and the alternating current signal is present at the source terminal of the power FET. In an example, the low impedance path has an impedance more than one order of magnitude less than an impedance existing between the gate terminal of the power FET and the source terminal of the power FET when the power FET is in a conductive state.

BRIEF DESCRIPTION OF THE DRAWINGS

For a detailed description of various examples, reference will now be made to the accompanying drawings in which:

FIG. 8 shows a schematic diagram of an illustrative circuit in accordance with various examples;

FIG. 11 shows a diagram of illustrative waveforms of signals in accordance with various examples;

FIG. 12 shows a diagram of illustrative radio frequency detector trigger levels in accordance with various examples.

DETAILED DESCRIPTION

Some circuits implemented in certain applications benefit from protection, mitigation, and/or other immunity from radio frequency (RF) interference. For example, some circuits implemented in a vehicle (e.g., automobile, train, airplane, boat, etc.) can benefit from RF interference immunity due to the varying environments that the circuits may pass through during transit of the vehicle and/or a length of cable runs within the vehicle coupling one of the circuits to another circuit or component. In some examples, RF immunity testing is provided at a system level through bulk current injection testing, for example, for an entire circuit board or system as opposed to at a component level for each component of the circuit or circuit of the system. To test circuits for RF interference immunity in the vehicle context, in some examples a direct power injection (DPI) test is performed. In at least some examples, the DPI test includes coupling an alternating current (AC) signal source to an input terminal and/or an output terminal of a device under test (DUT) while varying characteristics of the AC signal to determine whether operation of the DUT is altered by the presence of the AC signal. The AC signal, when varied (e.g., varied in frequency and magnitude), simulates the RF interference. For example, the DPI test determines whether an on and/or off condition of the DUT changes in the presences of the AC signal, whether output signals of the DUT change in the presences of the AC signal, and/or whether other signal characteristics (such as duty cycle) of signals of the DUT change in the presence of the AC signal. For example, in at least some DUTs, presence of the AC signal causes the DUT to turn on under conditions for which the DUT is not intended to turn on and/or the DUT is damaged based on the presence of the AC signal, such as the AC signal at a particular frequency and/or magnitude.

At least some aspects of the present disclosure provide for a circuit that mitigates the effects of RF interference (e.g., provides RF interference immunity or partial immunity) on the circuit. For example, the present disclosure provides for mitigation of RF interferences imparted on the circuit at the output terminal of the circuit, such as a source terminal of a power transistor (e.g., a metal oxide semiconductor field effect transistor (MOSFET)), by detecting the existence of the RF interference and reconfiguring the circuit when the RF interference is present. In at least one example architecture, when the RF interference is present, a plurality of transistors are biased to create a low impedance path between a gate terminal and a source terminal of the power transistor to create a discharge path between the gate terminal of the power transistor and the source terminal of the power transistor, thereby, in at least some examples, preventing unintended and/or undesirable turn-on of the power transistor.

Figure 1:
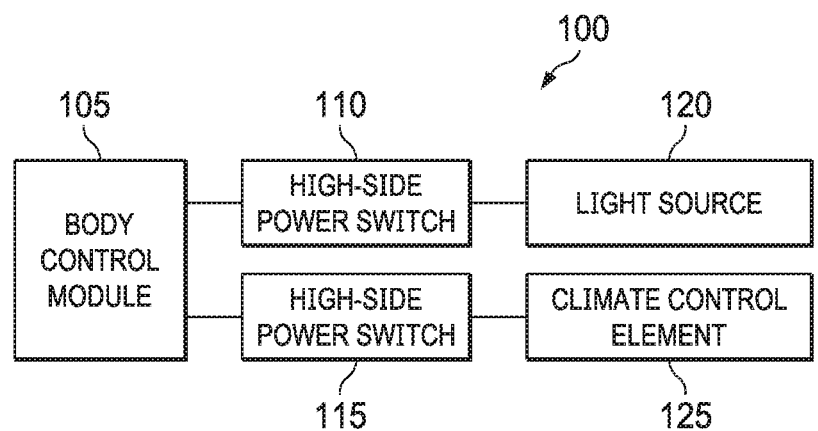
FIG. 1 shows a block diagram of an illustrative system in accordance with various examples.

Turning now to FIG. 1, a block diagram of an illustrative system 100 is shown. In at least some examples, the system 100 is implemented in an automobile (not shown) to control one or more aspects of the automobile. In other examples, the system 100 is implemented in other vehicles (whether land, sea, or air based). In at least one example, the system 100 includes a body control module 105, a high-side power switch 110, a high-side power switch 115, a light source 120 (e.g., a headlight, dome light, dashboard light, turn signal, brake light, light emitting diode, incandescent light, or any other suitable form of light source), and a climate control element 125 (e.g., a seat heater, a seat cooler/blower, an infuser, an air conditioning system (hot and/or cold), etc.). In at least some examples, the body control module 105 is coupled to, and configured to control, the high-side power switch 110 and the high-side power switch 115. The high-side power switch 110 is in turn coupled to, and configured to control, the light source 120 and the high-side power switch 115 is in turn coupled to, and configured to control, the climate control element 125. Although only two high-side power switches are shown in system 100 and each controls only one respective load (e.g., the light source 120 and the climate control element 125) for the sake of ease of understanding and description, in practice the system 100 can include any number of high-side power switches and/or loads and a high-side power switch can be coupled to and configured to control any one or more loads. In at least some examples, the high-side power switch 115 is implemented as a multi-chip module (MCM), for example, such that the high-side power switch 115 includes a power FET die (not shown) and a controller die (not shown) that are coupled together via inter-die bond wires in a single integrated circuit (IC) package. In other examples, the high-side power switch 115 takes any suitable form according to the descriptions herein, whether that form is implemented on a single die or multiple dies and/or is implemented in a single IC package or multiple IC packages.

In at least one example of operation of the system 100, the body control module 105 receives input and, based on that input, generates and outputs a control signal. The input is received from any suitable source such as a user input device (e.g., a switch, a button, a touch screen device, a remote control, etc.) (not shown), a sensor (not shown), and/or an antenna (e.g., such as an antenna providing connectivity to the Internet or another network or device that provides data to the body control module 105) (not shown). Based on the received input, the body control module 105 generates the control signal, for example, based on processing of the inputs by processing logic (e.g., a processor, a microprocessor, an application specific integrated circuit (ASIC), one or more digital logic gates, a field-programmable gate array (FPGA), etc.) (not shown) of the body control module 105. The control signal is output by the body control module 105 to a high-side power switch such as the high-side power switch 110 or the high-side power switch 115 to cause the high-side power switch to provide power, or cease providing power, to a load.

For example, when the body control module 105 receives input indicating a change in status of the light source 120 should occur (e.g., change from off to on or vice versa), the body control module 105 generates a control signal and provides the control signal to the high-side power switch 110. Based on the received control signal, the high-side power switch 110 conducts, or ceases conducting, between two terminals of the high-side power switch 110 to effect the change to the light source 120 indicated by the input received by the body control module 105. In another example, when the body control module 105 receives input indicating a change in status of the climate control element 125 should occur (e.g., change from off to on or vice versa), the body control module 105 generates a control signal and provides the control signal to the high-side power switch 115. Based on the received control signal, the high-side power switch 115 conducts, or ceases conducting, between two terminals of the high-side power switch 115 to effect the change to the climate control element 125 indicated by the input received by the body control module 105.

In at least some examples, the high-side power switch 110 and/or the high-side power switch 115 can be susceptible to RF interference that alters operational characteristics of the high-side power switch 110 and/or the high-side power switch 115. Such altered operational characteristics can include controlling a load to turn on or off without receiving a corresponding control signal from the body control module 105, providing an output signal having an incorrect value, etc. The RF interference can be caused by any number of sources, including at least environmental conditions through which the system 100 passes and/or a length of conductors coupling the various components of the system 100. In at least some examples, the high-side power switch 110 and/or the high-side power switch 115 are at least partially protected (e.g., immunized) against the RF interference to prevent or mitigate the occurrence of the altered operational characteristics. For example, in at least some architectures, the high-side power switch 110 and/or the high-side power switch 115 are immunized against RF interference having a power of up to 30 decibel-milliwatts (dBm). In other architectures, the high-side power switch 110 and/or the high-side power switch 115 are immunized against RF interference having a power greater than 30 dBm.

Figure 2:
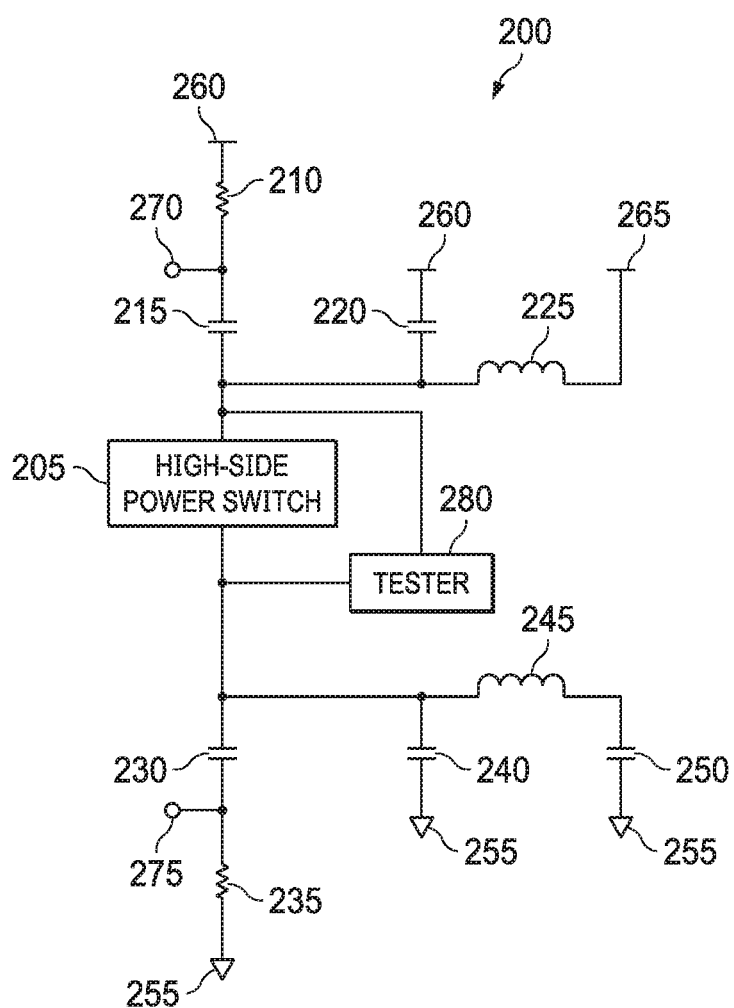
FIG. 2 shows a schematic diagram of an illustrative test system in accordance with various examples.

Turning now to FIG. 2, a schematic diagram of an illustrative test system 200 is shown. In at least some examples, the test system 200 is configured to test operation and/or performance of a high-side power switch (e.g., such as the high-side power switch 110 or the high-side power switch 115 of the system 100 of FIG. 1). For example, the test system 200 is configured to perform a direct power injection (DPI) test of a high-side power switch (sometimes referred to in the context of the test system 200 as a device under test (DUT) in which a RF signal is applied to an input terminal and/or an output terminal of the DUT to simulate RF interference being imparted on those respective terminals of the DUT. In at least some examples, the test system 200 includes a DUT implemented here as a high-side power switch 205 (e.g., such as the high-side power switch 110 or the high-side power switch 115 of the system 100 of FIG. 1), a resistor 210, a capacitor 215, a capacitor 220, an inductor 225, a capacitor 230, a resistor 235, a capacitor 240, an inductor 245, and a resistor 250.

In at least one example architecture, the resistor 210 is coupled between a voltage source 260 and a node 270 and the capacitor 215 is coupled between the node 270 and the input terminal of the high-side power switch 205. The capacitor 220 is coupled between the input terminal of the high-side power switch 205 and the voltage source 260. The inductor 225 is coupled between the input terminal of the high-side power switch 205 and a battery terminal 265. The capacitor 230 is coupled between the output terminal of the high-side power switch 205 and a node 275 and the resistor 235 is coupled between the node 275 and a ground node 255. The capacitor 240 is coupled between the output terminal of the high-side power switch 205 and the ground node 255. The inductor 245 is coupled between the output terminal of the high-side power switch 205 and the resistor 250 which is also coupled to the ground node 255.

In at least some examples, the node 270 is an input terminal injection point configured to couple to a signal generator or signal source to receive the RF signal and provide the RF signal to the input terminal of the high-side power switch 205. Similarly, in some examples the node 275 is an output terminal injection point configured to couple to a signal generator or signal source to receive the RF signal and provide the RF signal to the output terminal of the high-side power switch 205. The capacitor 220 and the capacitor 240 are representative of input and output capacitors, respectively, used in some architectures in conjunction with the high-side power switch 205 for filtering input or output signals of the high-side power switch 205. Accordingly, in some examples the capacitor 220 and/or the capacitor 240 may be selectively omitted from the test system 200, for example, to simulate operation of the high-side power switch 205 and response of the high-side power switch 205 to the RF signal in the absence of input or output filtering.

In a first example of operation of the test system 100, a RF signal is provided to the node 270. The RF signal passes through the capacitor 215 to the input terminal of the high-side power switch 205 and is blocked from passing to the battery terminal 265 by the inductor 225. Similarly, a direct current (DC) signal flows from the battery terminal 265 through the inductor 225 and high-side power switch 205 to the resistor 250 which functions as a load in the test system 200. In a second example of operation of the test system 200, the RF signal is provided to the node 275. The RF signal passes through the capacitor 230 to the output terminal of the high-side power switch 205 and is blocked from passing to the resistor 250 by the inductor 245. Similarly, the DC signal flows from the battery terminal 265 through the inductor 225 and high-side power switch 205 to the resistor 250. In each of the examples of operation, the RF signal is stepped up from a frequency of about 150 kilohertz (kHz) to a frequency of about 1 gigahertz (GHz) and from a power level of about 0 dBm to a power level of about 30 dBm at each frequency step.

In at least one implementation of the test system 200, the resistor 210 and the resistor 235 each have a resistance of about 50 ohms, the capacitor 215 and the capacitor 230 each have a capacitance of about 6.8 nano Farads (nF), the capacitor 220 has a capacitance of about 100 nF, the capacitor 240 has a capacitance of about 22 nF, the inductor 225 and the inductor 245 each have an inductance of about 4.7 micro Henries (uF), and the resistor 250 has a resistance of about 10 ohms or about 1.6 ohms. For example, to perform a test of the high-side power switch 205 for moderate load conditions, the resistor 250 has the resistance value of about 10 ohms. To perform a test of the high-side power switch 205 for large load conditions (e.g., such as 80% of maximum load), the resistor 250 has the resistance value of about 1.6 ohms. In various other examples, the components of the test system 200 may have other values. For example, in various examples values of the capacitor 220 and/or the capacitor 240 are altered to change the effect of filtering on the high-side power switch 205 and/or the value of the resistor 250 is altered to simulate different load conditions for the high-side power switch 205.

Figure 3:
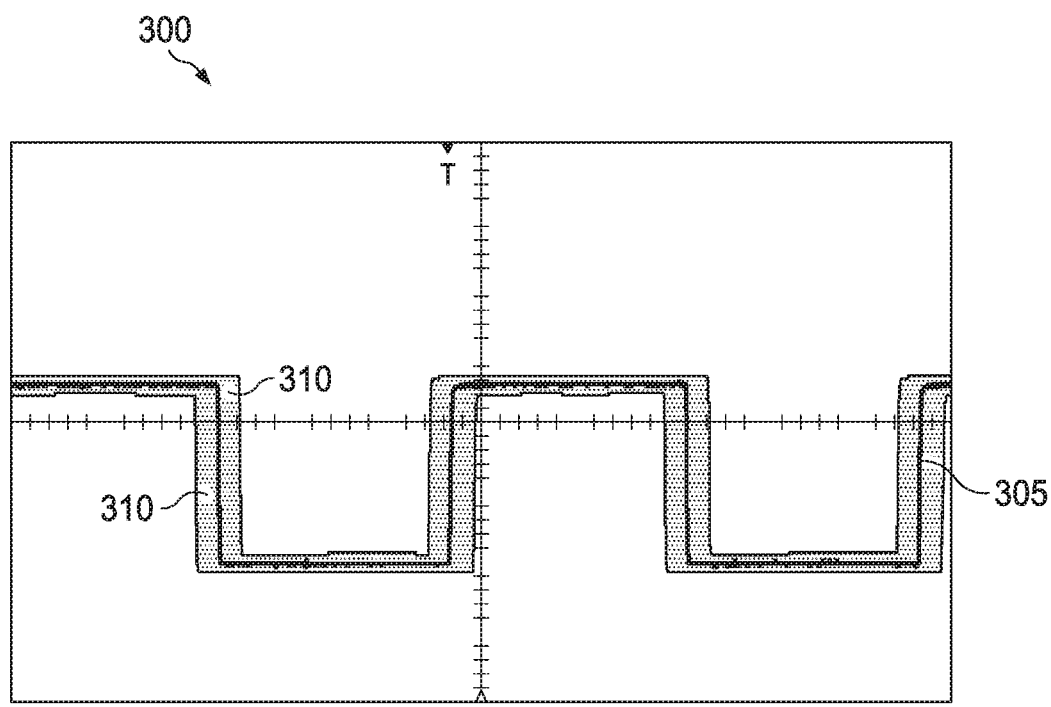
FIG. 3 shows a graph illustrating example signals from a test system in accordance with various examples.
Figure 4:
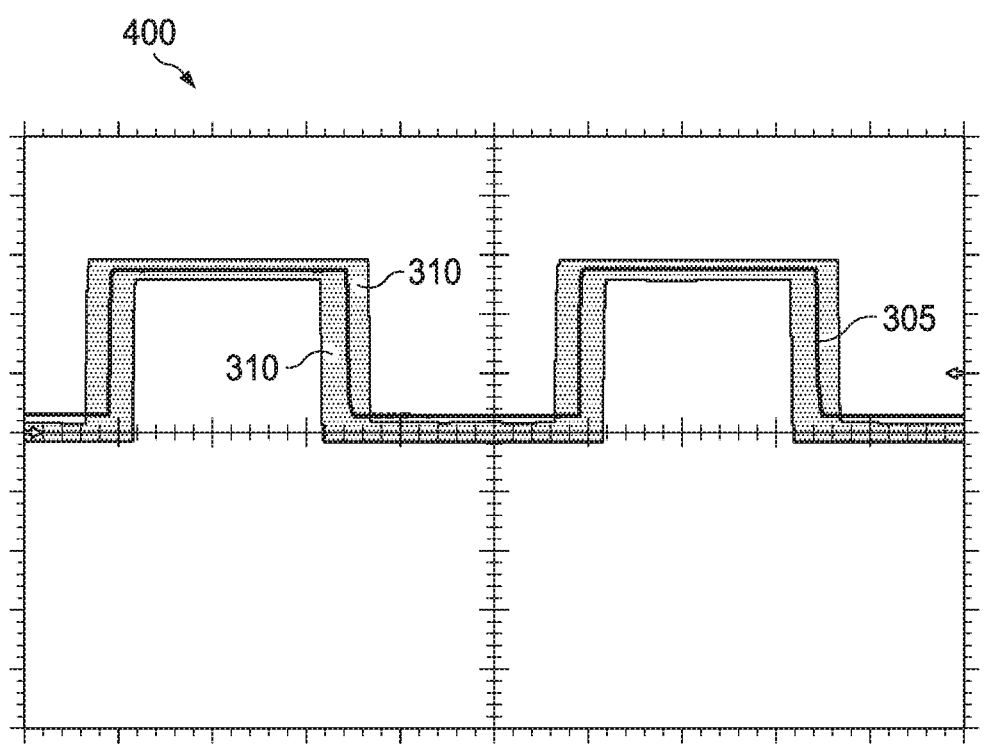
FIG. 4 shows a graph illustrating example signals from a test system in accordance with various examples.

One or more terminals, nodes, and/or components of the test system 200 are monitored to determine performance and/or operational characteristics of the test system 200, and particularly characteristics relating to the high-side power switch 205. For example, a tester 280 monitors the test system 200 to determine whether the high-side power switch 205 passes the DPI test. In at least one example, the tester 280 includes one or more probes (not shown) configured to couple to components of the test system 200 (e.g., such as an input or drain terminal of a FET (not shown) of the high-side power switch 115 and/or an output or source terminal of the FET of the high-side power switch 115). Turning to FIG. 3, a graph 300 illustrating example signals from the test system 200 is shown. The graph 300 includes a signal 305 measured by the tester 280 from the high-side power switch 205 and a signal mask 310 generated by the tester 280 that varies in both positive and negative directions by five percent from a specified turn on/turn off voltage of the high-side power switch 205. When the signal 305 remains within the signal mask 310, the high-side power switch 205 passes the DPI test for the specific frequency and power level of the RF signal imparted on the high-side power switch 205 at a time coinciding with the graph 300. However, as shown in FIG. 4, which shows a graph 400 illustrating example signals from the test system 200 for an illustrative high-side power switch other than the high-side power switch 205, when the signal 305 exceeds the signal mask 310, either in the positive direction as shown in FIG. 4 or the negative direction (not shown), the high-side power switch fails the DPI test for the specific frequency and power level of the RF signal imparted on the high-side power switch at a time coinciding with the graph 400. In at least one example, signal 305 of graph 400 is representative of an output signal of the high-side power switch for a load of 10 ohms and a frequency of operation of 100 hertz (Hz) during a DPI test step of 110 megahertz (MHz) and 30 dBm. Under these test conditions, in some examples, the high-side power switch output increases from about zero volts to about two volts and the high-side power switch conducts about 200 milliamps (mA) during a period of time in which the high-side power switch should be outputting about zero volts and zero mA, thereby failing the DPI test and potentially damaging a load coupled to the high-side power switch.

Figure 5:
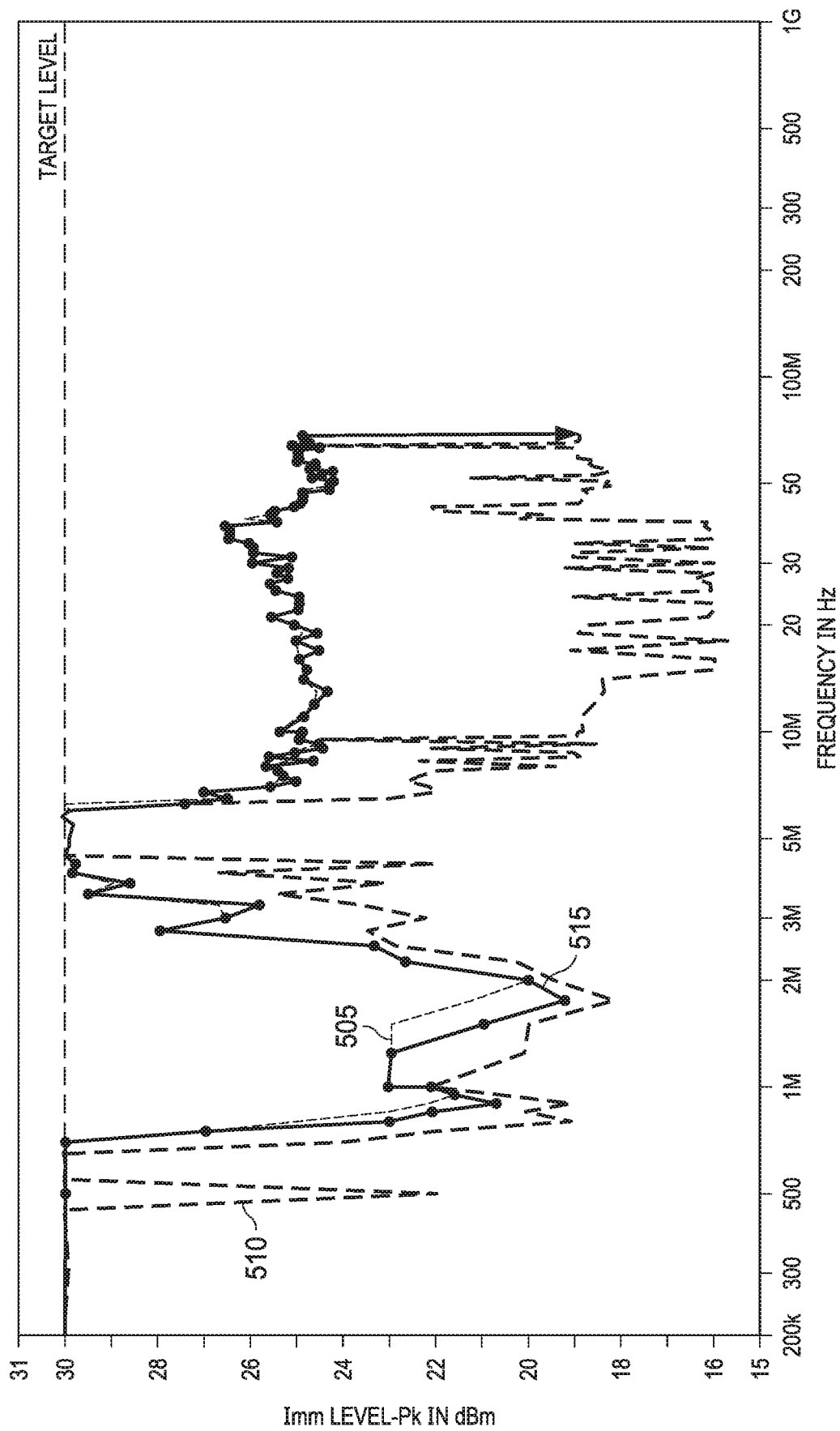
FIG. 5 shows a direct power injection pass/fail plot in accordance with various examples.

In at least some examples, the tester 280 further generates a DPI pass/fail spectrum plot illustrating results of the DPI test across all frequency and power ranges tested. An example of such a plot is shown as illustrative plot 500 of FIG. 5. In plot 500, signal 505 represents the maximum power level detected by the tester 280 for an instantaneous fail of the high-side power switch 205. Signal 510 represents the minimum power level detected by the tester 280 for an instantaneous fail of the high-side power switch 205. Signal 515 represents the average power level detected by the tester 280 for turn on/turn off conditions of the high-side power switch 205 to fall outside of an acceptable range (e.g., as illustrated and explained above with respect to the signal 305 and signal mask 310 of FIG. 3 and FIG. 4).

The plot 500 illustrates signals corresponding to an illustrative high-side power switch other than the high-side power switch 205 that fails the DPI test. For example, as shown in plot 500 the high-side power switch fails the DPI test for frequencies greater than 5 MHz In various other examples, the plot 500 illustrates failures of the high-side power switch for certain frequencies less than 5 MHz; however, these failures are not considered herein. As further illustrated by plot 500 (e.g., at approximately 69 MHz), damage to the high-side power switch may occur. For example, when the high-side power switch conducts current in unintended circumstances, current flowing through the high-side power switch may rise, increasing the temperature of the high-side power switch. As the temperature of the high-side power switch reaches a critical point, thermal runaway may occur, damaging the high-side power switch irreparably and potentially leading to damage for a load coupled to the high-side power switch.

Figure 6:
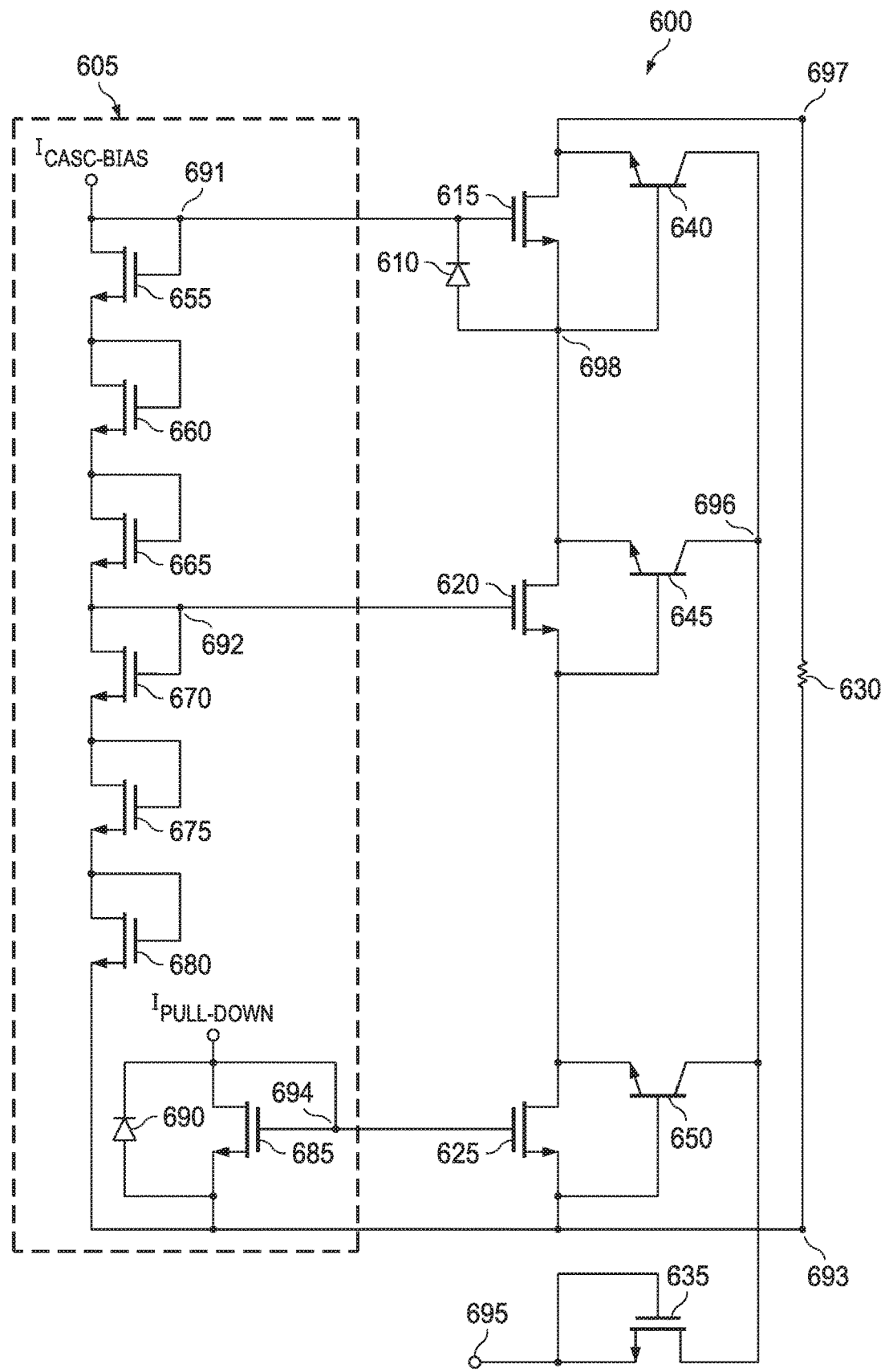
FIG. 6 shows a schematic diagram of an illustrative circuit in accordance with various examples.

Turning now to FIG. 6, a schematic diagram of an illustrative circuit 600 is shown. In at least some examples, the circuit 600 is illustrative of a gate driver of a high-side power switch, such as the high-side power switch other than the high-side power switch 205, discussed above with respect to FIG. 4 and FIG. 5. In at least one example, the circuit 600 includes a bias circuit 605, a diode 610, a n-type metal oxide semiconductor field effect transistor (NMOS) 615, a NMOS 620, a NMOS 625, a resistor 630, a NMOS 635, and bi-polar junction transistor (BJT) 640, a BJT 645, and a BJT 650. In at least some examples, the bias circuit 605 includes a NMOS 655, a NMOS 660, a NMOS 665, a NMOS 670, a NMOS 675, a NMOS 680, a NMOS 685, and a diode 690. In at least some examples, the diode 690 is not a physical component, but is instead a drain-substrate junction diode of, and inherent to, the NMOS 685 and is illustrated and discussed herein for the sake of clarity and ease of understanding. Similarly, in at least some examples the BJT 640, BJT 645, and BJT 650 are not physical components but are instead parasitic NPN BJTs illustrated and discussed herein for the sake of clarity and ease of understanding.

In at least one example architecture, a drain terminal and a gate terminal of the NMOS 655 are coupled to a node 691, a drain terminal and a gate terminal of the NMOS 660 are coupled to a source terminal of the NMOS 655, a drain terminal and a gate terminal of the NMOS 665 are coupled to a source terminal of the NMOS 660, and a source terminal of the NMOS 665 is coupled to a node 692. A drain terminal and a gate terminal of the NMOS 670 are coupled to the node 692, a drain terminal and a gate terminal of the NMOS 675 are coupled to a source terminal of the NMOS 670, a drain terminal and a gate terminal of the NMOS 680 are coupled to a source terminal of the NMOS 675, and a source terminal of the NMOS 680 is coupled to a node 693. A source terminal of the NMOS 685 is coupled to the node 693, a drain terminal and a gate terminal of the NMOS 685 are coupled to a node 694, and the diode 690 is coupled between the source terminal and the drain terminal of the NMOS 685. In at least some examples, the node 691 is configured to couple to a current source (not shown) to receive a current signal (e.g., a bias current) $I_{CASC\text{-}BIAS}$ and the node 694 is configured to couple to a current source (not shown) to receive a current signal $I_{PULL\text{-}DOWN}$.

Continuing the example architecture, a gate terminal of the NMOS 615 is coupled to the node 691, a drain terminal of the NMOS 615 is coupled to the node 697, and a source terminal of the NMOS 615 is coupled to a node 698. The diode 610 is coupled between the node 698 and the node 691, for example, to provide gate-source protection of the NMOS 615. A gate terminal of the NMOS 620 is coupled to the node 692, a drain terminal of the NMOS 620 is coupled to the node 698, and a source terminal of the NMOS 620 is coupled to a drain terminal of the NMOS 625. A gate terminal of the NMOS 625 is coupled to the node 694 and a source terminal of the NMOS 625 is coupled to the node 693. The resistor 630 is coupled between the node 697 and the node 693. A gate terminal and a source terminal of the NMOS 635 are coupled to a node 695 and a drain terminal of the NMOS 625 is coupled to a node 696. A base terminal of the BJT 640 is coupled to the node 698, an emitter terminal of the BJT 640 is coupled to the node 697, and a collector terminal of the BJT 640 is coupled to the node 696. A base terminal of the BJT 645 is coupled to the source terminal of the NMOS 620, an emitter terminal of the BJT 640 is coupled to the node 698, and a collector terminal of the BJT 645 is coupled to the node 696. A base terminal of the BJT 645 is coupled to the node 693, an emitter terminal of the BJT 645 is coupled to the drain terminal of the NMOS 625, and a collector terminal of the BJT 640 is coupled to the node 696. In at least some examples, the node 695 is configured to couple to a voltage source (not shown) to receive a voltage signal $VBB_{PAD}$ (e.g., from a battery or other power source coupled to the circuit 600), the node 693 is a terminal configured to couple the circuit 600 to a source terminal of a power field effect transistor (FET) in a high-side power switch (not shown), and the node 697 is a terminal configured to couple the circuit 600 to a gate terminal of the power FET in the high-side power switch.

In at least one example, the architecture of circuit 600 is susceptible to the failures discussed herein and illustrated previously with respect to FIGS. 3-5, for example, when tested by the test system 200 or operationally deployed in the system 100. For example, when a RF signal is present at the node 693, in some circumstances current can flow from the node 695 to the node 697, increasing a value of a signal present at the node 697 to a level that in some circumstance may be unintended, undesirable, and/or my cause the power FET to operate in a manner other than intended in a given circuit application. As an example, when the RF signal is received at the node 693, it is assumed that the node 697 will follow the value of the node 693 because of a parasitic capacitance between gate and source terminals of the power FET coupled to node 697 and node 693, respectively. However, during a negative half-cycle of the RF signal, values present at certain nodes in the circuit 600, such as node 698, lag behind values present at the node 693 for a short period of time. This delay, in some examples, causes the BJT 640 to turn on, conducting from the node 696 to the node 697. The current provided by the BJT 640 to the node 697 in this circumstance is sometimes referred to as shoot-through current. The shoot-through current creates an asymmetry between half-cycles of the RF signal at the node 697, shifting a gate-to-source voltage ($V_{gs}$) of the power FET and causing the power FET, in at least some examples, to turn on and conduct between its drain and source terminals under conditions not intended to turn on the power FET.

Figure 7:
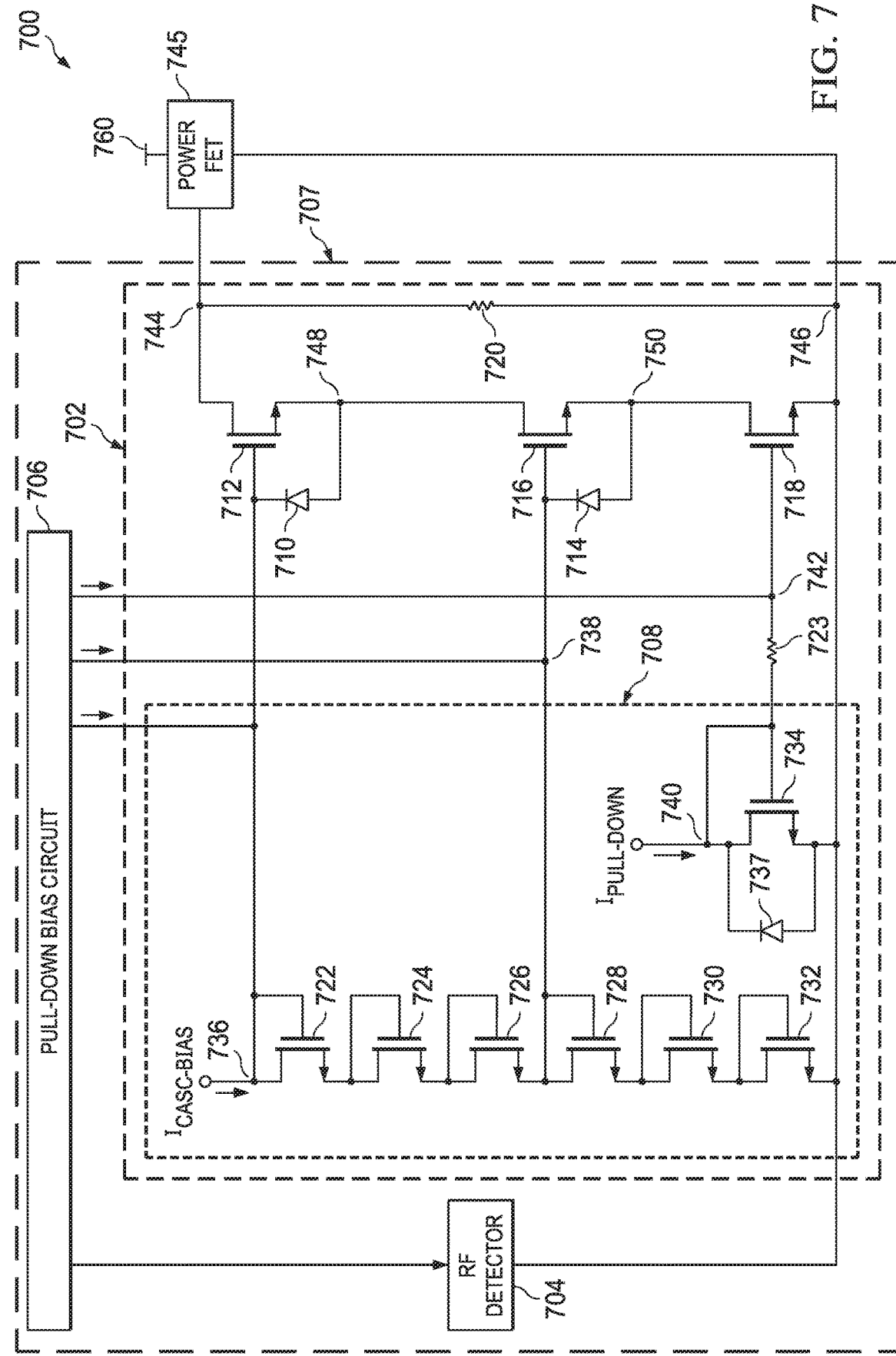
FIG. 7 shows a block diagram of an illustrative circuit in accordance with various examples.

Turning now to FIG. 7, a block diagram of an illustrative circuit 700 is shown. In at least some examples, the circuit 700 is illustrative of a high-side power switch, such as the high-side power switch 205, discussed with respect to the preceding figures, and is configured to compensate, negate, and/or otherwise mitigate the RF signal susceptibility discussed above with respect to FIG. 6 and illustrated in FIGS. 3 and 4.

In at least one example, the circuit 700 includes a gate pull-down circuit 702, a RF detector 704, a pull-down bias circuit 706, and a power FET 745. The gate pull-down circuit 702, the RF detector 704, and the pull-down bias circuit 706, in some examples, together form a gate driver 707. In some examples, the gate pull-down circuit includes a bias circuit 708, a diode 710, a NMOS 712, a diode 714, a NMOS 716, a NMOS 718, a resistor 720, and a resistor 723. The bias circuit 708 includes a NMOS 722, a NMOS 724, a NMOS 726, a NMOS 728, a NMOS 730, a NMOS 732, a NMOS 734, and a diode 737.

In at least one example architecture, a drain terminal and a gate terminal of the NMOS 722 are coupled to a node 736, a drain terminal and a gate terminal of the NMOS 724 are coupled to a source terminal of the NMOS 722, a drain terminal and a gate terminal of the NMOS 726 are coupled to a source terminal of the NMOS 724, and a source terminal of the NMOS 726 is coupled to a node 736. A drain terminal and a gate terminal of the NMOS 728 are coupled to the node 738, a drain terminal and a gate terminal of the NMOS 730 are coupled to a source terminal of the NMOS 728, a drain terminal and a gate terminal of the NMOS 732 are coupled to a source terminal of the NMOS 730, and a source terminal of the NMOS 732 is coupled to a node 746. A source terminal of the NMOS 734 is coupled to the node 746, a drain terminal and a gate terminal of the NMOS 734 are coupled to a node 740, and the diode 737 is coupled between the source terminal and the drain terminal of the NMOS 734. In at least some examples, the node 736 is configured to couple to a current source (not shown) to receive $I_{CASC\text{-}BIAS}$ and the node 740 is configured to couple to a current source (not shown) to receive $I_{PULL\text{-}DOWN}$.

Continuing the example architecture, a gate terminal of the NMOS 712 is coupled to the node 736, a drain terminal of the NMOS 712 is coupled to the node 744, and a source terminal of the NMOS 712 is coupled to a node 748. The diode 710 is coupled between the node 748 and the node 736. A gate terminal of the NMOS 716 is coupled to the node 738, a drain terminal of the NMOS 716 is coupled to the node 748, and a source terminal of the NMOS 716 is coupled to a node 750. The diode 714 is coupled between the node 750 and the node 738. A gate terminal of the NMOS 718 is coupled to a node 742, a drain terminal of the NMOS 718 is coupled to the node 750, and a source terminal of the NMOS 718 is coupled to the node 746. The resistor 720 is coupled between the node 744 and the node 746. The resistor 723 is coupled between the node 740 and the node 742. In at least some examples, the node 746 is a terminal configured to couple the gate pull-down circuit 702 to a source terminal of the power FET 745, and the node 744 is a terminal configured to couple the gate pull-down circuit 702 to a gate terminal of the power FET 745.

In at least one example of operation, the circuit 700 is suitable for and/or capable of detecting a RF signal (e.g., RF interference) present at node 746 and mitigating an effect of that RF signal on the circuit 700. For example, the RF detector 704 monitors the node 246 and, when a RF signal of sufficient amplitude and/or frequency is present at the node 246, controls the pull-down bias circuit 706 to bias gate terminals of one or more of the NMOS 712, NMOS 716, and/or NMOS 718. In at least some examples, biasing the gate terminals of the NMOS 712, NMOS 716, and NMOS 718 causes each of the NMOS 712, NMOS 716, and NMOS 718 to conduct between their respective source and drain terminals. The path created between node 744 and node 746 as a result of this conduction of the NMOS 712, NMOS 716, and NMOS 718 is a low impedance path (e.g., low impedance as compared to an impedance or resistance value of the resistor 720, such as a low impedance path with an impedance of about 2 kilo ohms). The low impedance path, in at least some examples, facilitates discharge of node 744 to node 746 to mitigate the asymmetry discussed above with respect to node 697 of circuit 600 of FIG. 6, and further prevents or mitigates the shift in the $V_{gs}$ of the power FET 745 in the presence of the RF signal at node 746. For example, the low impedance path facilitates discharge of node 744 to node 746 in a manner inhibited by the comparative large impedance value (e.g., such as three orders of magnitude larger impedance than the low impedance path) resistor 720. In at least some examples, mitigating the asymmetry in this way prevents the power FET 745 from turning on and conducting between its source and drain terminals under conditions not intended to turn on the power FET 745.

In at least some examples, the RF detector 704 activates and operates only during a time period in which the power FET 745 is intended to be turned off (e.g., such as based on a value of $I_{CASC\text{-}BIAS}$). When the power FET 745 is controlled to turn on (e.g., such that the power FET 745 conducts between a voltage source 760 and the node 748), in at least some examples, the RF detector 704 is in a standby mode in which the RF detector 704 and the pull-down bias circuit 706 have no functional and/or operational impact on the gate pull-down circuit 702 or gate driver 707. While in the standby mode, in at least some examples, the RF detector 704 consumes less than about 10 nanoamps (nA) of current. In other examples, while in the standby mode, in at least some examples, the RF detector 704 consumes less than about 8 nA of current, less than about 5 nA of current, or less than about 2 nA of current.

Turning now to FIG. 8, a schematic diagram of an illustrative circuit 800 is shown. In at least some examples, the circuit 800 is suitable for implementation as a RF detector, such as the RF detector 704 of the circuit 700, discussed above with respect to FIG. 7. In at least some examples, the circuit 800 includes a capacitor 802, a NMOS 804, a diode 806, a NMOS 808, a diode 810, a resistor 812, a NMOS 814, a NMOS 816, a resistor 818, a capacitor 820, a NMOS 822, a NMOS 824, and a resistor 826. In at least one implementation of the circuit 800, the capacitor 802 is a metal planar capacitor having a capacitance of about 700 femtofarads (fF), the resistor 812 has a resistance of about 20 kiloohms, the resistor 818 has a resistance of about 2 megaohms, the capacitor 802 has a capacitance of about 1 picofarad (pF), and the resistor 826 has a resistance of about 19 kiloohms, and the NMOS 808 and NMOS 824 are each 65 volt (V) drain extended NMOS (DENMOS) transistors. In various other examples, the components of the circuit 800 may have other values.

In at least one example architecture, a first terminal of the capacitor 802 is coupled between a node 828 and a node 832. The NMOS 804 has a gate terminal and a source terminal coupled to the node 832 and a drain terminal coupled to a node 840. The diode 806 is coupled between the node 832 and the node 840. The NMOS 808 has a gate terminal and a source terminal coupled to a ground node 830 and a drain terminal coupled to the node 832. The diode 810 is coupled between the ground node 830 and the node 832. The resistor 812 is coupled between the node 840 and a node 834. The NMOS 814 has a gate terminal and a drain terminal coupled to the node 834 and a source terminal coupled to a node 836. The NMOS 816 has a gate terminal and a drain terminal coupled to the node 836 and a source terminal coupled to the ground node 830. The resistor 818 and the capacitor 820 are coupled between the node 834 and the ground node 830. The NMOS 822 has a drain terminal coupled to the node 834, a source terminal coupled to the ground node 830, and a drain terminal configured to couple to a control device (not shown) and receive a disable control signal (DIS). The NMOS 824 has a gate terminal coupled to the node 834, a drain terminal configured to couple to an outside device (e.g., such as the pull-down bias circuit 706 of circuit 700 discussed above with respect to FIG. 7). The resistor 826 is coupled between a source terminal of the NMOS 824 and the ground node 830. In at least one example, the node 828 is a terminal configured to couple the circuit 800 to a source terminal of a power FET 745, as discussed above with respect to FIG. 7.

In at least one example of operation of the circuit 800, the circuit 800 detects the presence of a RF signal at node 828 and, based on both the presence of the RF signal and an amplitude of the RF signal, controls the NMOS 824 to turn on and conduct current between its source and drain terminals or turn off and not conduct current between its source and drain terminals. In at least one example, the capacitor 802 couples the RF signal from the node 828 to the node 832. The diode 810, which in some examples is a drain/substrate junction diode of the NMOS 808, and the diode 806, which in some examples is the drain/substrate junction diode of the NMOS 804 together rectify the RF signal at node 828 to create a DC signal present at node 840 that is provided to the node 834 by the resistor 812. In some examples, the resistor 812 is omitted and the DC signal is provided directly to the node 834 by the node 840 (e.g., such that the node 834 and the node 840 are effectively the same node and/or net in the circuit 800). During a negative half-period of the RF signal present at node 828, the diode 810 clamps a voltage of node 832 at about −0.6 V (e.g., a negative diode voltage, where the diode voltage is determined by electrical characteristics of the diode 810), providing half-rectification of the RF signal present at node 828. During a positive half-period of the RF signal present at node 828, the diode 806 substantially passes the RF signal to node 840 (e.g., minus a diode voltage of about 0.6 V where the diode voltage is determined by electrical characteristics of the diode 806). In an example under ideal conditions in which all diode voltages are equal, the resulting signal at node 840 has a DC value of one-half of the amplitude of the RF signal present at node 828 and is further approximately equal to the DC value of the DC signal present at node 834 after filtering by the resistor 818 and the capacitor 820. In practical application, in at least some examples, a mismatch in diode voltages of the diode 810 and the diode 806 creates a DC offset in the DC signal present at node 834 and node 840.

In some examples, the NMOS 804 and the NMOS 808 rectify the RF signal when the RF signal has a frequency of about 1 MHz to about 1 GHz. Based on the signal present at node 834, the NMOS 824 turns on and conducts current between its source and drain terminals or turns off and does not conduct current between its source and drain terminals. For example, when a voltage differential between a value of the signal present at node 834 and a value of a signal present at the source terminal of the NMOS 824 exceeds a predefined threshold (e.g., a threshold determined by the characteristics of the NMOS 824), the NMOS 824 turns on and conducts current between its source and drain terminals. When the voltage differential between the value of the signal present at node 834 and the value of a signal present at the source terminal of the NMOS 824 does not exceed the predefined threshold, the NMOS 824 turns off and does not conduct current between its source and drain terminals. When the NMOS 824 conducts current between its source and drain terminals, in at least some examples the NMOS 824 sinks current from a device or component coupled to the drain terminal of the NMOS 824 (e.g., node 838). In some examples, the circuit 800 is configured and constructed such that when a peak-to-peak voltage of the RF signal is greater than about 5 V, the signal present at node 834 is sufficient to cause the NMOS 824 to turn on and conduct current between its source and drain terminals and when the peak-to-peak voltage of the RF signal is less than about 5 V, the signal present at node 834 is insufficient to cause the NMOS 824 to turn on and conduct current between its source and drain terminals (e.g., the NMOS 824 is turned off and does not conduct current between its source and drain terminals).

In some examples, the capacitor 820 filters at least some of any residual AC components from the signal present at node 834 after rectification. During an electrostatic discharge (ESD) strike, in at least some examples a voltage present at the node 828 is clamped to a value of about 40 V to provide protection for the NMOS 824. For example, the NMOS 804, NMOS 808, resistor 812, NMOS 814, and NMOS 816 limit current and voltage present at node 834 and thereby provide the protection for the NMOS 824. Additionally, in some examples the NMOS 822 operates as a disable switch to prevent the NMOS 824 from turning on even in the presence of a signal at node 834 that is otherwise sufficient to cause the NMOS 824 to turn on. For example, when the power FET having a source terminal coupled to the node 828 is turned on and conducting current, the NMOS 822 is also turned on and conducting current between its source and drain terminals to couple the node 834 to the ground node 830 and prevent the NMOS 824 from turning on. In this way, the NMOS 824 is prevented from turning on and sinking current while the power FET having a source terminal coupled to the node 828 is turned on and conducting current, thereby preventing unintended effect by the circuit 800 on operation of the power FET having a source terminal coupled to the node 828 while the power FET having a source terminal coupled to the node 828 is turned on and conducting current.

Figure 9A:
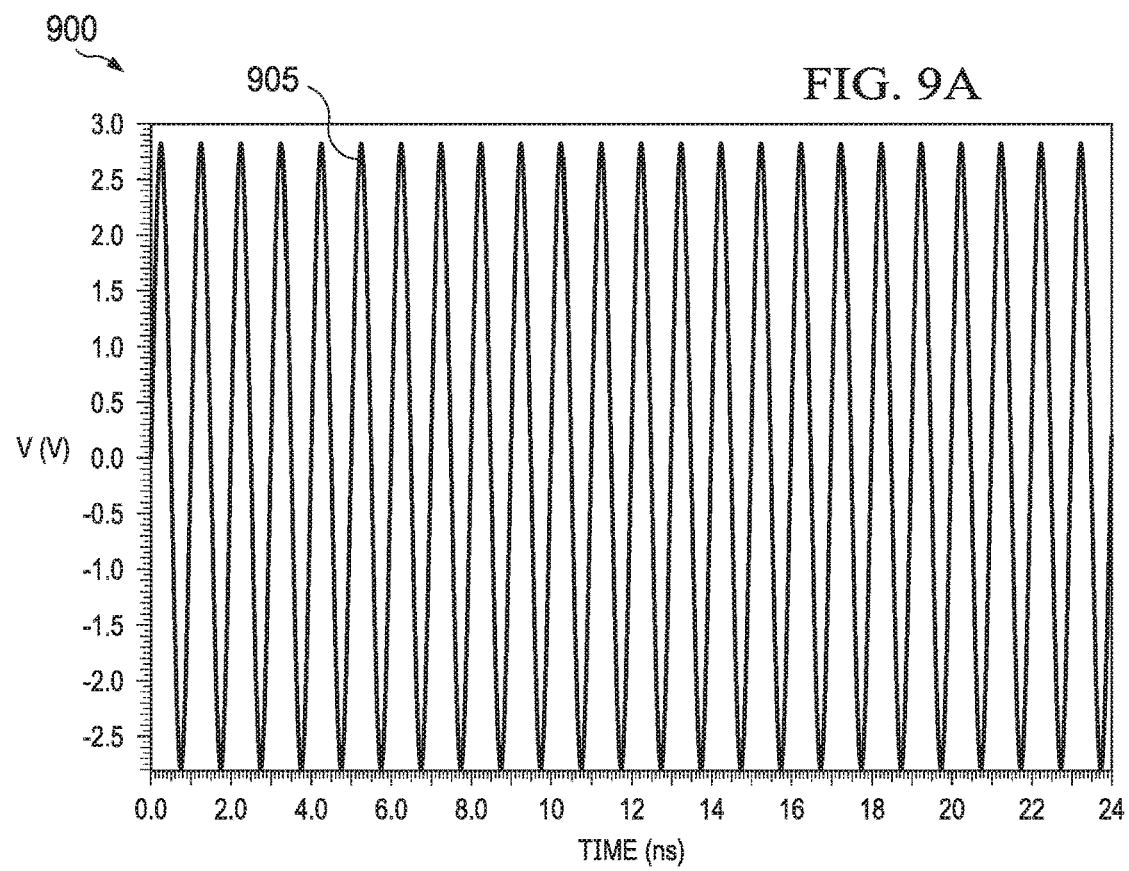
FIG. 9A shows a diagram of an illustrative signal present at a node in a circuit in accordance with various examples.
Figure 9B:
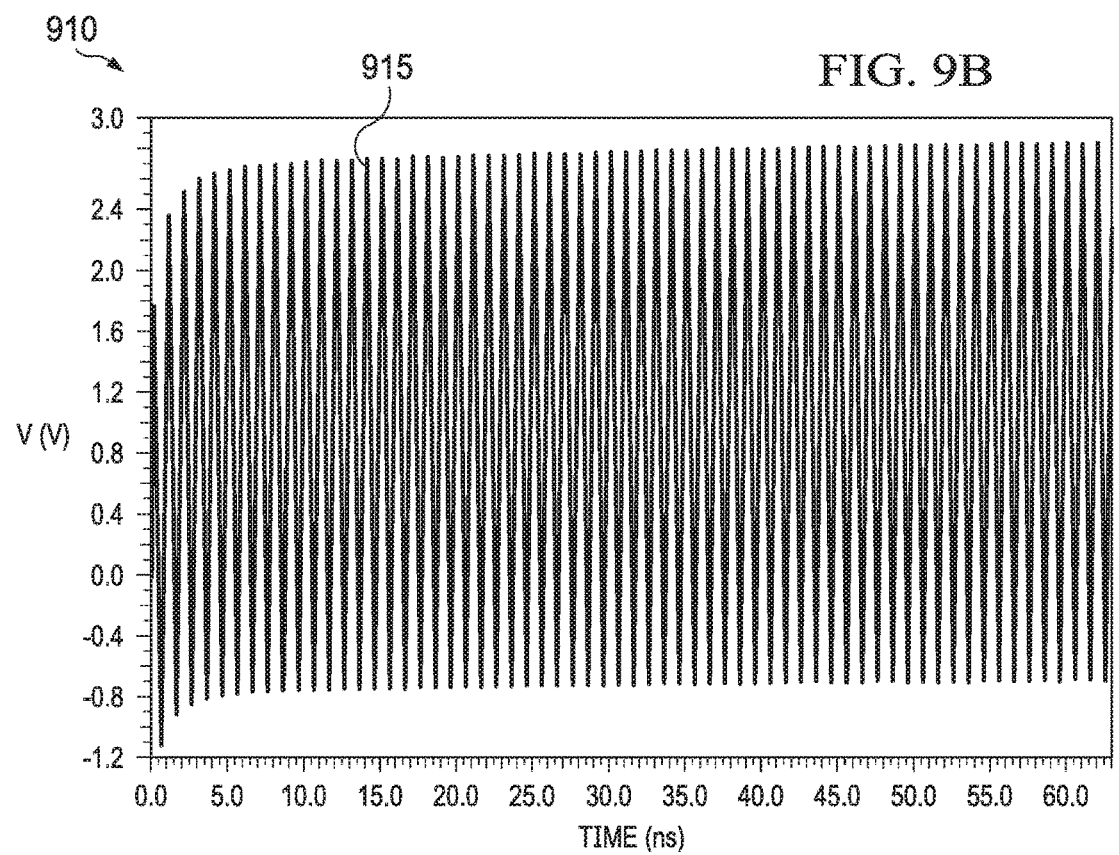
FIG. 9B shows a diagram of an illustrative signal present at a node in a circuit in accordance with various examples.
Figure 9C:
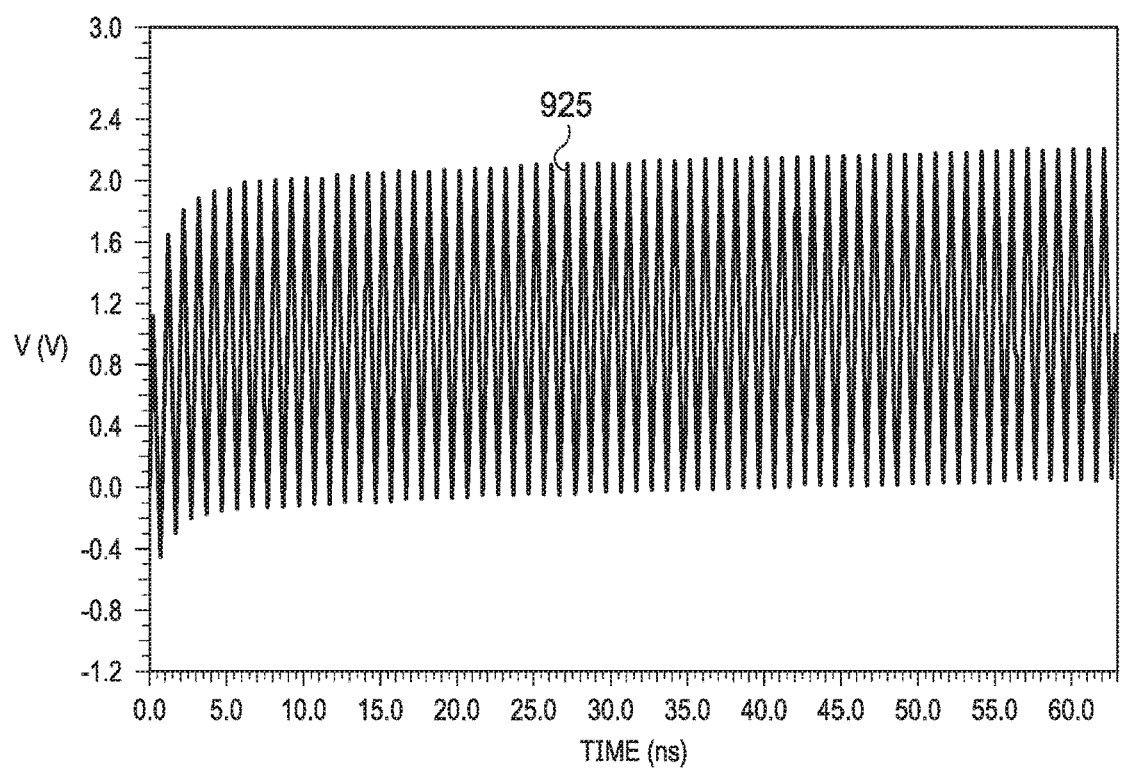
FIG. 9C shows a diagram of an illustrative signal present at a node in a circuit in accordance with various examples.
Figure 9D:
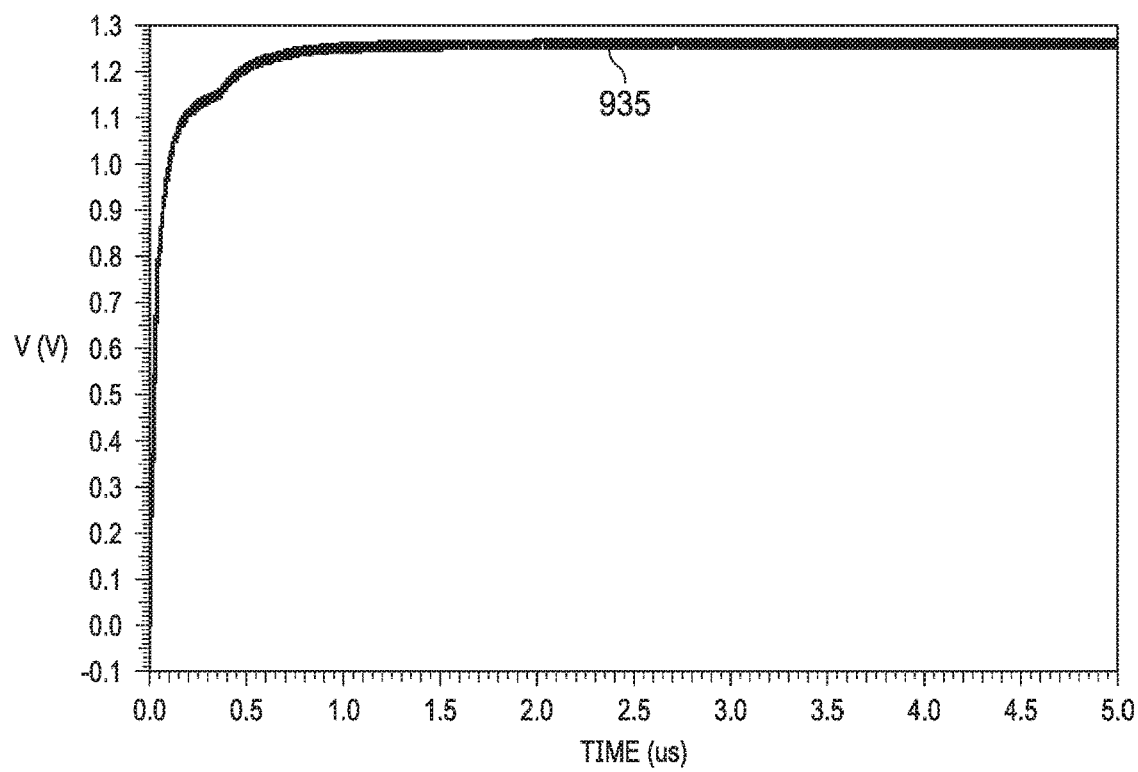
FIG. 9D shows a diagram of an illustrative signal present at a node in a circuit in accordance with various examples.

Turning now to FIGS. 9A-9D, diagrams of illustrative waveforms of a signal progressing through the circuit 800 are shown. FIG. 9A is a diagram 900 of an illustrative signal 905 present at node 828. For example, the signal 905 is the RF signal (e.g., RF interference) received at node 828 having a peak-to-peak voltage ($V_{p-p}$) of 5.6 (e.g., about 19 dBm) at a frequency of 1 GHz. As shown in diagram 900, the horizontal axis represents time in nanoseconds (ns) and the vertical axis represents voltage in volts. FIG. 9B is a diagram 910 of an illustrative signal 915 present at node 832. For example, the signal 915 is the RF signal coupled by the capacitor 802 from the node 828 to the node 830. As shown in diagram 910, the horizontal axis represents time in ns and the vertical axis represents voltage in V. FIG. 9C is a diagram 920 of an illustrative signal 925 present at node 840. For example, the signal 925 is the rectified signal present at node 840, rectified from node 832 by the NMOS 804 and the NMOS 808. As shown in diagram 920, the horizontal axis represents time in ns and the vertical axis represents voltage in V. FIG. 9D is a diagram 930 of an illustrative signal 935 present at node 834. For example, the signal 935 is the signal for controlling the NMOS 824 and has a voltage of about 1.2 V based on the 5.6 $V_{p-p}$ RF signal received at node 828 and illustrated in diagram 900. As shown in diagram 930, the horizontal axis represents time in microseconds (us) and the vertical axis represents voltage in V.

Figure 10:
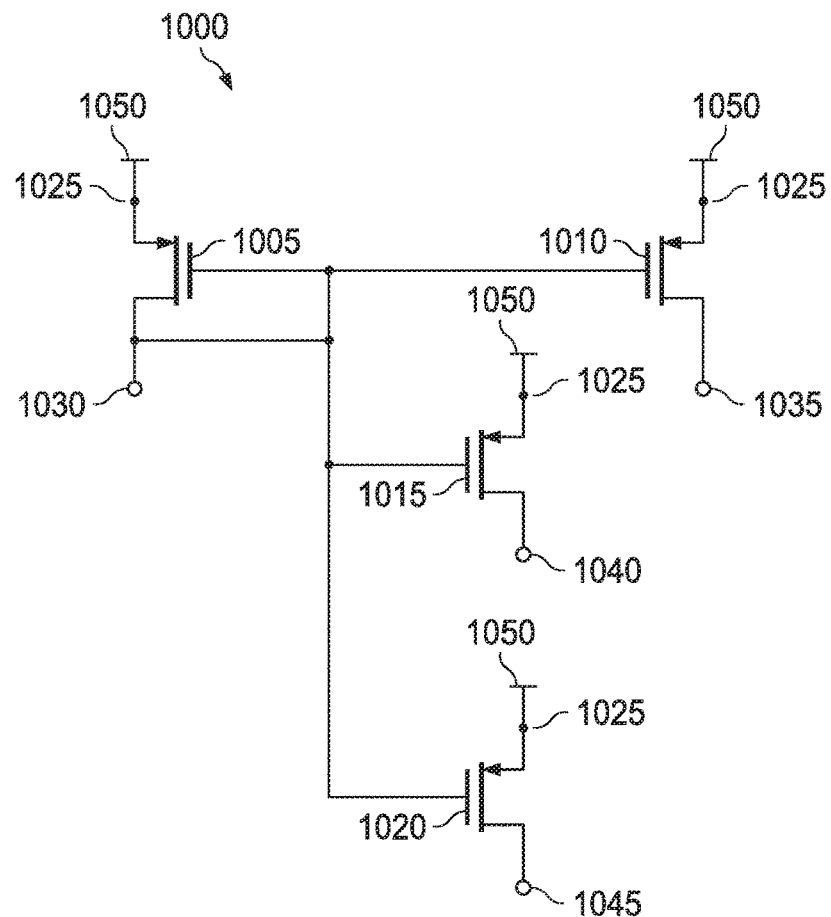
FIG. 10 shows a schematic diagram of an illustrative circuit in accordance with various examples.

Turning now to FIG. 10, a schematic diagram of an illustrative circuit 1000 is shown. In at least some examples, the circuit 1000 is suitable for implementation as a pull-down bias circuit, such as the pull-down bias circuit 706 of the circuit 700, discussed above with respect to FIG. 7. In at least some examples, the circuit 1000 comprises a plurality of current mirrors, each configured to substantially mirror a current present at one node to another respective node while isolating the nodes from one other. For example, the circuit 1000 includes a p-type metal oxide semiconductor field effect transistor (PMOS) 1005, a PMOS 1010, a PMOS 1015, and a PMOS 1020. The PMOS 1005 has a source terminal coupled to a node 1025, a gate terminal couple to a node 1030, and a drain terminal coupled to the node 1030. The PMOS 1010 has a gate terminal coupled to the node 1030, a source terminal coupled to the node 1025, and a drain terminal coupled to a node 1035. The PMOS 1015 has a gate terminal coupled to the node 1030, a source terminal coupled to the node 1025, and a drain terminal coupled to a node 1040. The PMOS 1020 has a gate terminal coupled to the node 1030, a source terminal coupled to the node 1025, and a drain terminal coupled to a node 1045. In at least some examples, the node 1025 is configured to couple to a voltage source 1050. In at least some examples, the node 1030 is configured to couple to the node 838 of the circuit 800 of FIG. 8 such that a current sunk by the NMOS 824 of the circuit 800 is sunk through the PMOS 1005 from the node 1025 and mirrored by the PMOS 1010 to the node 1035, by the PMOS 1015 to the node 1040, and by the PMOS 1020 to the node 1045. In at least some examples, the node 1035 is configured to couple to the node 736, the node 1040 is configured to couple to the node 738, and the node 1045 is configured to couple to the node 742, each of the circuit 700 discussed above with respect to FIG. 7. For example, based on the current mirrored from the node 1025 to the node 1035, the node 1040, and the node 1045, and correspondingly to the node 736, the node 738, and the node 742 respectively, the NMOS 712, NMOS 716, and NMOS 718 of FIG. 7 are controlled (e.g., biased) to create the low impedance path between node 744 and node 746, as discussed above with respect to FIG. 7, thereby mitigating for the RF signal detected at the node 746 of FIG. 7.

Turning now to FIG. 11, a diagram 1100 of illustrative waveforms of signals is shown. In at least some examples, the diagram 1100 is illustrative of signals present in the circuit 700, discussed above with respect to FIG. 7, and reference is made to components of FIG. 7 in describing FIG. 11. For example, the diagram 1100 includes a signal 1105 illustrating a $V_{gs}$ of the NMOS 712, a signal 1110 illustrating a $V_{gs}$ of the NMOS 716, and a signal 1115 illustrating a $V_{gs}$ of the NMOS 718. As shown in diagram 1100, the horizontal axis represents time in us and the vertical axis represents voltage in V. As illustrated in diagram 1100, when the RF detector 704 is disabled (e.g., when the power FET 745 is active and/or turned on), the signal 1105, signal 1110, and signal 1115 have values as shown in the time period 1120. For example, when the RF detector is disabled, the NMOS 712 and the NMOS 716 have a $V_{gs}$ of about 1.5 V and the NMOS 718 has a $V_{gs}$ of less than about 0.5 V.

When the power FET 745 is turned off, the RF detector 704 becomes active. As shown during the time period 1125, when a RF signal sufficient to cause the RF detector 704 to control the pull-down bias circuit 706 to bias the NMOS 712, NMOS 716, and NMOS 718 is received at node 746, the NMOS 712, NMOS 716, and NMOS 718 are biased to operate in a triode region of operation. In at least some examples, biasing the NMOS 712, NMOS 716, and NMOS 718 to operate in a triode region of operation comprises a reconfiguration of the circuit 700, reconfiguring the NMOS 712, NMOS 716, and NMOS 718 from an active current sink to a switch stack. As shown in FIG. 11 for an illustrative RF signal received at node 746 of about 5.6 $V_{p-p}$ at 1 GHz, the NMOS 712 and the NMOS 716 are biased to have a $V_{gs}$ of about 5.5 V and the NMOS 718 is biased to have a $V_{gs}$ of about 6.3 V.

Turning now to FIG. 12, a diagram 1200 illustrating RF detector trigger levels is shown. In at least some examples, the diagram 1200 is illustrative of trigger levels for causing the RF detector 704 to cause the pull-down bias circuit 706 to bias the NMOS 712, NMOS 716, and NMOS 718 to operate in the triode region. As shown in diagram 1200, at about 25 dBm and greater power levels (shown as a shaded region in FIG. 12), in at least some examples, the power FET 745 experiences a thermal runaway failure that in at least some circumstances is irreversibly destructive to the power FET 745. To mitigate and/or protect against this failure, a worst-case trigger level of the RF detector 704 is below about 25 dBm with an allowed overhead margin for protection. As further shown in diagram 1200, the trigger level of the RF detector 704 varies with nominal and weak transistor process corners. As illustrated, worst-case trigger levels at the weak transistor process corners are approximately less than or equal to 20 dBm across the full frequency range of operation of the RF detector 704. In at least some examples, nominal and strong (not shown) transistor process corners yield lower trigger levels for the RF detector 704 and higher margin to the range resulting in thermal runaway. Accordingly, as shown in the diagram 1200, the RF detector 704 is suitable for protecting the power FET 745 from reaching a thermal runaway region of operations under sustained RF signal injection.

Figure 13:
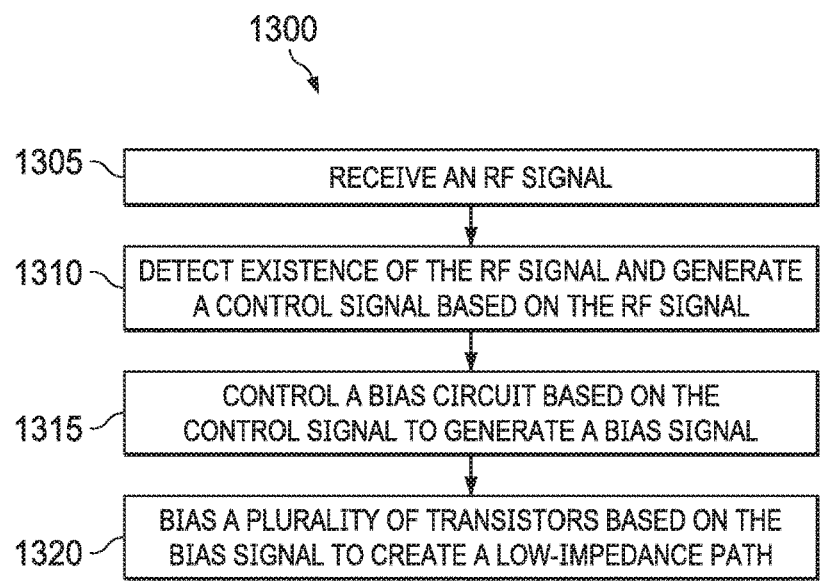
FIG. 13 shows a flowchart of an illustrative method in accordance with various examples.

Turning now to FIG. 13, a flowchart of an illustrative method 1300 is shown. In at least some examples, the method 1300 is implemented by a circuit, such as the circuit 700 of FIG. 7, to protect a power FET against effects of RF interference (e.g., a received RF signal) imparted on a source terminal of the power FET. In at least some examples, the circuit implementing the method 1300 is a high-side power switch, such as a high-side power switch suitable for implementation in a vehicle as discussed with respect to FIG. 1.

At operation 1305, the circuit receives a RF signal. The RF signal is, in some examples, RF interference caused by the circuit passing through an environment in which the electrostatic conditions create the RF interferences. In other examples, the RF signal is generated based on effects of a length of wiring in a system including the circuit (e.g., such as wiring harnesses in an automobile).

At operation 1310, the circuit detects existence of the RF signal and generates a control signal based on the RF signal. For example, the circuit detects the existence of the RF signal and generates the control signal via a RF signal detector. In at least some examples, the circuit generates the control signal by rectifying the RF signal. In at least some examples, the circuit rectifies the RF signal when the RF signal has a frequency of about 1 MHz to about 1 GHz.

At operation 1315, the circuit controls a bias circuit based on the control signal to generate a bias signal. For example, when the RF signal has a value of about 5 $V_{p-p}$ or greater, in some examples the control signal has a value sufficient to cause a transistor to turn on and conduct current. The transistor turning on and conducting current sinks current through a current mirror of the bias circuit that mirrors the sunk current to generate the bias signal.

At operation 1320, the circuit biases a plurality of transistors based on the bias signal to create a low impendence path in the circuit. Each of the plurality of transistors, in at least one example, is a component of a gate pull-down portion of the circuit. In at least some examples, the low impedance path passes through the plurality of transistors to couple a gate terminal of power FET to the source terminal of the power FET. Coupling the gate terminal of power FET to the source terminal of the power FET, in at least some examples, mitigates effects of the RF signal on the circuit by discharging built up charge at the gate terminal of the power FET to the source terminal of the power FET.

In at least some examples, the circuit mitigates received RF signals of up to about 30 dBm across a spectrum of a plurality of frequencies. Mitigating for the received RF signals when the power FET is turned off, in at least some examples, prevents unintended operation of the power FET (e.g., turning on (or off) the power FET under unintended conditions) and/or prevent an erroneous signal value of an output of the power FET. In at least some examples, when the power FET is turned on, the circuit disables the RF detector such that the circuit does not determine whether an RF signal is present. When the RF detector is disabled, the RF detector has substantially no effect on operation of the power FET and consumes less than about 10 nA of current.

In the foregoing discussion, the terms "including" and "comprising" are used in an open-ended fashion, and thus should be interpreted to mean "including, but not limited to . . . . " Also, the term "couple" or "couples" is intended to mean either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., field effect transistor (FET), MOSFET, n-type, p-type, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means +/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
a first capacitor having a first terminal coupled to a first node and a second terminal coupled to a second node;
a first transistor having a drain terminal coupled to the second node, a source terminal coupled to a ground node, and a gate terminal coupled to the ground node;
a second transistor having a gate terminal coupled to the second node, a source terminal coupled to the second node, and a drain terminal coupled to a third node;
a first resistor coupled between the third node and a fourth node;
a second resistor coupled between the fourth node and the ground node;
a second capacitor coupled between the fourth node and the ground node;
a third transistor having a drain terminal coupled to the fourth node, a source terminal coupled to the ground node, and a gate terminal;
a fourth transistor having a gate terminal coupled to the fourth node, a drain terminal coupled to a fifth node, and a source terminal; and
a third resistor coupled between the source terminal of the fourth transistor and the ground node.

2. The circuit of claim 1, further comprising:
a fifth transistor having a drain terminal coupled to the fourth node, a gate terminal coupled to the fourth node, and a source terminal coupled to a sixth node;
a sixth transistor having a drain terminal coupled to the sixth node, a gate terminal coupled to the sixth node, and a source terminal coupled to the ground node;
a first diode coupled between the second node and the ground node; and
a second diode coupled between the second node and the third node.

3. The circuit of claim 1, further comprising:
a seventh transistor having a drain terminal coupled to the fifth node, a gate terminal coupled to the fifth node, and a source terminal configured to couple to a power supply;
an eighth transistor having a gate terminal coupled to the fifth node, a source terminal configured to couple to the power supply, and a drain terminal;
a ninth transistor having a gate terminal coupled to the fifth node, a source terminal configured to couple to the power supply, and a drain terminal; and
a tenth transistor having a gate terminal coupled to the fifth node, a source terminal configured to couple to the power supply, and a drain terminal.

4. The circuit of claim 3, further comprising:
an eleventh transistor having a gate terminal coupled to a seventh node, a drain terminal coupled to an eighth node, and a source terminal coupled to a ninth node;
a twelfth transistor having a gate terminal coupled to a tenth node, a drain terminal coupled to the ninth node, and a source terminal coupled to an eleventh node;
a thirteenth transistor having a gate terminal coupled to a twelfth node, a drain terminal coupled to the eleventh node, and a source terminal coupled to the first node;
a third diode coupled between the ninth node and the seventh node; and
a fourth diode coupled between the eleventh node and the tenth node,
wherein the drain terminal of the eighth transistor is coupled to the seventh node, the tenth node, and the twelfth node,
wherein the drain terminal of the ninth transistor is coupled to the tenth node; and
wherein the drain terminal of the tenth transistor is coupled to the twelfth node.

5. The circuit of claim 4, further comprising:
a fourth resistor coupled between the twelfth node and a thirteenth node;
a fourteenth transistor having a gate terminal coupled to the thirteenth node, a drain terminal coupled to the thirteenth node, and a source terminal coupled to the ground node; and
a fifth diode coupled between the ground node and the thirteenth node, wherein the thirteenth node is configured to couple to a first constant current source.

6. The circuit of claim 4, further comprising:
a fifteenth transistor having a gate terminal coupled to the seventh node, a drain terminal coupled to the seventh node, and a source terminal coupled to a fourteenth node;
a sixteenth transistor having a gate terminal coupled to the fourteenth node, a drain terminal coupled to the fourteenth node, and a source terminal coupled to a fifteenth node;
a seventeenth transistor having a gate terminal coupled to the fifteenth node, a drain terminal coupled to the fifteenth node, and a source terminal coupled to the tenth node;
an eighteenth transistor having a gate terminal coupled to the tenth node, a drain terminal coupled to the tenth node, and a source terminal coupled to a sixteenth node;
a nineteenth transistor having a gate terminal coupled to the sixteenth node, a drain terminal coupled to the sixteenth node, and a source terminal coupled to a seventeenth node; and
an twentieth transistor having a gate terminal coupled to the seventeenth node, a drain terminal coupled to the seventeenth node, and a source terminal coupled to the first node,
wherein the seventh node is configured to couple to a second constant current source.

7. The circuit of claim 4, further comprising a fifth resistor coupled between the eighth node and the first node.

8. The circuit of claim 4, further comprising a power field effect transistor having a gate terminal coupled to the eighth node, a source terminal coupled to the first node, and a drain terminal.

9. A system, comprising:
a radio frequency (RF) detector circuit comprising:
a capacitor having a first terminal coupled to a first node and a second terminal coupled to a second node;
a first transistor having a drain terminal coupled to the second node, a source terminal coupled to a ground node, and a gate terminal coupled to the ground node;

a second transistor having a gate terminal coupled to the second node, a source terminal coupled to the second node, and a drain terminal coupled to a third node;
a first resistor coupled between the third node and a fourth node;
a second resistor coupled between the fourth node and the ground node;
a second capacitor coupled between the fourth node and the ground node;
a third transistor having a drain terminal coupled to the fourth node, a source terminal coupled to the ground node, and a gate terminal;
a fourth transistor having a gate terminal coupled to the fourth node, a drain terminal coupled to a fifth node, and a source terminal; and
a third resistor coupled between the source terminal of the fourth transistor and the ground node;
a gate pull-down circuit comprising:
a fifth transistor having a gate terminal coupled to a sixth node, a drain terminal coupled to a seventh node, and a source terminal coupled to an eighth node;
a sixth transistor having a gate terminal coupled to a ninth node, a drain terminal coupled to the eighth node, and a source terminal coupled to a tenth node;
a seventh transistor having a gate terminal coupled to an eleventh node, a drain terminal coupled to the tenth node, and a source terminal coupled to the first node;
a first diode coupled between the eighth node and the sixth node;
a second diode coupled between the tenth node and the ninth node; and
a fourth resistor coupled between the seventh node and the first node;
a pull-down bias circuit comprising:
an eighth transistor having a drain terminal coupled to the fifth node, a gate terminal coupled to the fifth node, and a source terminal configured to couple to a second power supply;
a ninth transistor having a gate terminal coupled to the fifth node, a source terminal configured to couple to the second power supply, and a drain terminal coupled to the sixth node;
a tenth transistor having a gate terminal coupled to the fifth node, a source terminal configured to couple to the second power supply, and a drain terminal coupled to the ninth node; and
an eleventh transistor having a gate terminal coupled to the fifth node, a source terminal configured to couple to the second power supply, and a drain terminal coupled to the eleventh node;
a power field effect transistor (FET) having a gate terminal coupled to the seventh node, a source terminal coupled to the first node, and a drain terminal configured to couple to a first power supply; and
a load having a first terminal coupled to the first node and a second terminal coupled to the ground node.

10. The system of claim 9, further comprising:
a twelfth transistor having a drain terminal coupled to the fourth node, a gate terminal coupled to the fourth node, and a source terminal coupled to a twelfth node;
a thirteenth transistor having a drain terminal coupled to the twelfth node, a gate terminal coupled to the twelfth node, and a source terminal coupled to the ground node;
a third diode coupled between the second node and the ground node; and
a fourth diode coupled between the second node and the third node.

11. The system of claim 9, wherein the RF detector, the gate pull-down circuit, the pull-down bias circuit, and the power FET together form a high-side power switch implemented in an automotive body module.

12. The system of claim 9, wherein the RF detector controls the pull-down bias circuit to reconfigure the fifth transistor, the sixth transistor, and the seventh transistor from operation as an active current sink to operation as a switch stack in the presence of a RF signal at the first node.

13. The system of claim 12, wherein reconfiguring the fifth transistor, the sixth transistor, and the seventh transistor from operation as the active current sink to operation as the switch stack reconfigures the gate pull-down circuit to low impedance path between the seventh node and the first node, wherein the low impedance path has an impedance value a plurality of orders of magnitude less than an impedance value of the fourth resistor.

14. The system of claim 12, wherein the RF detector controls the pull-down bias circuit to reconfigure the fifth transistor, the sixth transistor, and the seventh transistor to operate as the switch stack when the RF signal has a value of less than or equal to about 30 decibel-milliwatts (dBm) in a frequency range of about 1 megahertz (MHz) to about 1 gigahertz (GHz).

15. The system of claim 9, wherein the RF detector circuit is disabled by the fourth transistor when the power FET is in a conductive state, wherein the RF detector is enabled via the fourth transistor when the power FET is in a non-conductive state, and wherein the RF detector circuit consumes less than 10 nanoamps of current when the power FET is in the conductive state.

16. A circuit, comprising:
a power field effect transistor (FET) having a gate terminal, a source terminal, and
a drain terminal;
a gate pull-down circuit configured to couple to the gate terminal of the power FET and the source terminal of the power FET to control operation of the power FET;
a pull-down bias circuit coupled to the gate pull-down circuit; and
a radio frequency (RF) detector coupled to the source terminal of the power FET and the pull-down bias circuit and configured to:
detect a presence of an alternating current signal at the source terminal of the power FET when the power FET is in a non-conductive state; and
control the pull-down bias circuit to bias the gate pull-down circuit to create a low impedance path between the gate terminal of the power FET and the source terminal of the power FET when the power FET is in the non-conductive state and the alternating current signal is present at the source terminal of the power FET,
wherein the low impedance path has an impedance more than one order of magnitude less than an impedance existing between the gate terminal of the power FET and the source terminal of the power FET when the power FET is in a conductive state.

17. The circuit of claim 16, wherein the RF detector comprises:
a planar capacitor having a first terminal coupled to a first node and a second terminal coupled to a second node;

a first transistor having a drain terminal coupled to the second node, a source terminal coupled to a ground node, and a gate terminal coupled to the ground node;

a second transistor having a gate terminal coupled to the second node, a source terminal coupled to the second node, and a drain terminal coupled to a third node;

a first resistor coupled between the third node and a fourth node;

a second resistor coupled between the fourth node and the ground node;

a second capacitor coupled between the fourth node and the ground node;

a third transistor having a drain terminal coupled to the fourth node, a source terminal coupled to the ground node, and a gate terminal;

a fourth transistor having a gate terminal coupled to the fourth node, a drain terminal coupled to a fifth node, and a source terminal; and a third resistor coupled between the source terminal of the fourth transistor and the ground node.

18. The circuit of claim 16, wherein the gate pull-down circuit comprises:

a fifth transistor having a gate terminal coupled to a sixth node, a drain terminal coupled to a seventh node, and a source terminal coupled to an eighth node;

a sixth transistor having a gate terminal coupled to a ninth node, a drain terminal coupled to the eighth node, and a source terminal coupled to a tenth node;

a seventh transistor having a gate terminal coupled to an eleventh node, a drain terminal coupled to the tenth node, and a source terminal coupled to the first node;

a first diode coupled between the eighth node and the sixth node;

a second diode coupled between the tenth node and the ninth node; and a fourth resistor coupled between the seventh node and the first node.

19. The circuit of claim 18, wherein the low impedance path is a path through the fifth transistor, the sixth transistor, and the seventh transistor created by the pull-down bias circuit biasing the fifth transistor, the sixth transistor, and the seventh transistor to operate in a triode region of operation, reconfiguring the fifth transistor, the sixth transistor, and the seventh transistor from functioning as an active current sink to functioning as a switch stack.

20. The circuit of claim 16, wherein the pull-down bias circuit comprises a current mirror configured to mirror a current from the RF detector to the gate pull-down circuit to bias the gate pull-down circuit to create the low impedance path.

* * * * *